United States Patent [19]
Yoshikawa et al.

[11] Patent Number: 5,926,519
[45] Date of Patent: Jul. 20, 1999

[54] SEMICONDUCTOR INTEGRATED CIRCUIT INCLUDING DYNAMIC REGISTERS

[75] Inventors: Megumi Yoshikawa, Yokohama; Yukinori Kudou, Fujisawa, both of Japan

[73] Assignee: Kabushiki Kaisha Toshiba, Kawasaki, Japan

[21] Appl. No.: 08/956,396

[22] Filed: Oct. 23, 1997

[30] Foreign Application Priority Data

Oct. 28, 1996 [JP] Japan .................................... 8-285154

[51] Int. Cl.⁶ .................................................. G11C 19/00
[52] U.S. Cl. ................................. 377/54; 377/77; 377/78; 377/79
[58] Field of Search ................................. 377/54, 77, 78, 377/79

[56] References Cited

U.S. PATENT DOCUMENTS

| | | | |
|---|---|---|---|
| 5,289,518 | 2/1994 | Nakao | 377/81 |
| 5,359,636 | 10/1994 | Aoyama | 377/73 |
| 5,619,157 | 4/1997 | Kumata et al. | 327/203 |

*Primary Examiner*—Kenneth B. Wells
*Assistant Examiner*—Minh Nguyen

*Attorney, Agent, or Firm*—Oblon, Spivak, McClelland, Maier & Neustadt, P.C.

[57] ABSTRACT

This invention relates to the structure of multiple registers used in image signal processing, and aims to simplify the register structure and to reduce the power consumption of the registers and the time required for testing an image signal processing LSI with the registers. A semiconductor integrated circuit according to the invention has a clock generation circuit and a clock buffer circuit for generating a plurality of clock signals, a register group including a plurality of registers connected in series and operable in synchronism with the clock signals, at least one combinational circuit connected to the register group, and means for selecting one of a normal operation mode and a scan test mode for the register group. The clock generation circuit receives a system clock $CP_{IN}$, a scan test mode selection signal $S_{MODEN}$, and clock $CPS_{IN}$, and outputs a clock $\phi$ and a clock ($\phi_1$ bar) controlled by the signal $S_{MODEN}$ such that the clocks have periods of "1" kept from overlapping each other, and also outputs a writing clock CPS used in the scan test mode. Since the register group is operated using the clocks, it is not necessary to form all registers of scan registers. As a result, the register group can be formed in a small area and made scannable. Moreover, the chip size and the power consumption can be further reduced by locating the clock buffer circuit adjacent to the register group.

1 Claim, 5 Drawing Sheets

SEMICONDUCTOR INTEGRATED CIRCUIT INCLUDING DYNAMIC REGISTERS

BACKGROUND OF THE INVENTION

This invention relates to a circuit structure of multiple dynamic registers used for image signal processing, and more particularly to a semiconductor integrated circuit including dynamic registers, which can contribute to structural simplification and power saving of an image signal processor formed as an LSI, and to shortening the time required for testing the processor.

In most LSIs for image signal processing, registers occupy ⅓ or more of the whole circuit. Therefore, the circuit complexity of each register significantly influences the integration level of the LSI chip. Further, in general, it is extremely difficult to test the functions of the image signal processing LSI from the outside, since in the LSI, logic gates constituted of a combinational circuit and registers constituted of a sequential circuit are connected in a complicated manner.

In the prior art, a method for enabling automatic generation of test data for such LSIs by a computer is generally employed to increase the error detection rate of test data. In this method, at the LSI function test, registers incorporated therein are connected in chains by means of a control signal supplied from the outside of the LSI, so that they can be made scannable. Then, scan data is input from the outside to the LSI so that the sequential circuit, which shows complex transition of circuit states, can be processed as a combinational circuit for which test data can be prepared easily.

A static register is used as the conventional register for the image signal processing LSI, which is designed by an ASIC (Application Specific Integrated Circuit) technique. First, the circuit structure and the operation of a static nonscan register as an example of the static register will be described, which does not have a scanning function for facilitating the function test.

Figure 1:
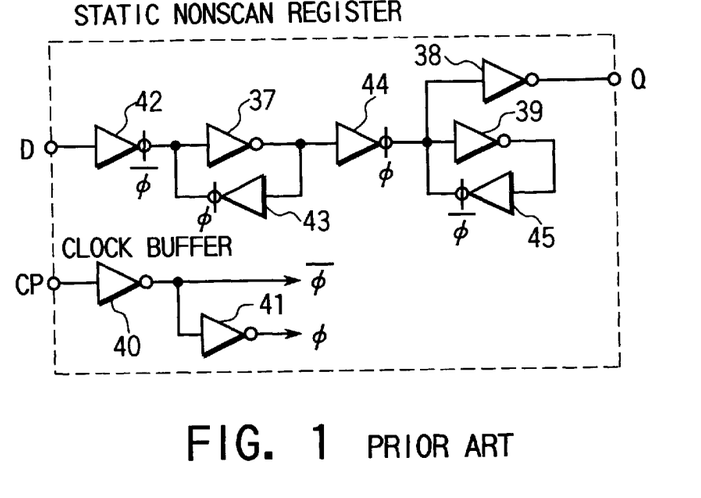
FIG. 1 is a circuit diagram, showing a conventional static nonscan register.

FIG. 1 shows a typical circuit structure of the conventional 1-bit static nonscan register. Specifically, the circuit structure comprises a nonscan register and a clock buffer for writing data into the nonscan register and reading data therefrom. The nonscan register consists of inverters 37–41 and clocked inverters 42–45. Each clocked inverter functions as an inverter when a clock with a value of "1" is input to the control terminal, and shows a high impedance state when a clock with a value of "0" is input thereto.

In FIG. 1, a clock is input through the input terminal CP of the clock buffer, an inverted clock ($\phi$ bar) for data writing is output from the inverter 40, and a clock $\phi$ for data reading is output from the inverters 40 and 41.

Data input through the data input terminal D of the static nonscan register is input to the inverter 37 when the clock with the value of "1" is input to the control terminal ($\phi$ bar) of the clocked inverter 42 (i.e., when the terminal ($\phi$ bar) of the clocked inverter 42 is at "1"). When the clocks with the values of "0" and "1" are input to the control terminal ($\phi$ bar) of the clocked inverter 42 and the control terminal $\phi$ of the clocked inverter 43, respectively (i.e., when the terminals ($\phi$ bar) and $\phi$ of the clocked inverters 42 and 43 are at "0" and "1", respectively), the data input to the inverter 37 is held in it, which means that the register is in a written state.

Then, when the control terminal $\phi$ of the clocked inverter 44 is shifted to "1", the written data is read out from the output terminal Q of the register via the clocked inverter 44 and the inverter 38 and simultaneously transferred to the inverter 39. When the control terminal $\phi$ of the clocked inverter 44 and the control terminal ($\phi$ bar) of the clocked inverter 45 are at "0" and "1", respectively, the read data is held.

The 1-bit static nonscan register shown in FIG. 1 is characterized in that the clock buffer is included in a region enclosed with the broken line, and located near the nonscan register, and also that the nonscan register has twenty-six transistors and each of the outputs of the terminals $\phi$ and ($\phi$ bar) of the clock buffer drives four of the transistors.

The circuit structure and the operation of a static scan register with a scanning function for facilitating the function test will now be described.

Figure 2:
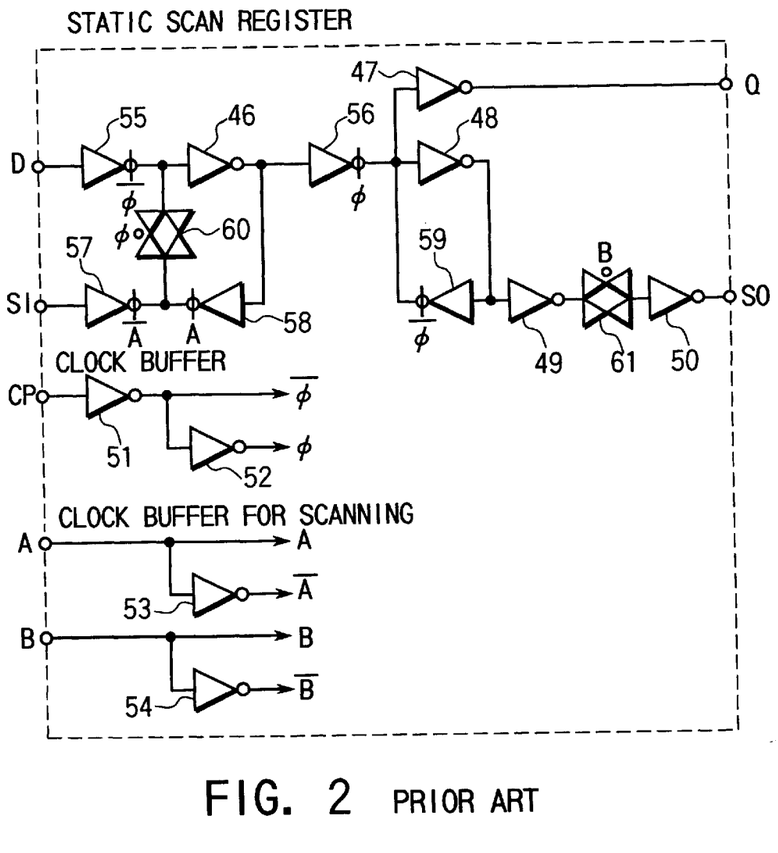
FIG. 2 is a circuit diagram, showing a conventional static scan register.

FIG. 2 shows a typical circuit structure of the conventional 1-bit static scan register. Specifically, the circuit structure comprises a scan register, a clock buffer and a clock buffer for scanning. The scan register consists of inverters 46–54, clocked inverters 55–59 and transfer gates 60 and 61.

In FIG. 2, when a clock is input through the input terminal CP of the clock buffer, an inverted clock ($\phi$ bar) for data writing is output from the inverter 51, and a clock $\phi$ for data reading is output from the inverters 51 and 52. Further, when a clock A for scanning is input through the input terminal A of the scanning clock buffer, a clock (A bar) for scan data writing is output from the inverter 53. The clock A is also used to hold the scan data. A clock B for scanning is used to read scan data.

The normal operation mode of the static scan register will be described. In the normal operation mode, clocks (A bar) and B are set at "0".

Data input through a terminal D is supplied to the inverter 46 when the control terminal ($\phi$ bar) of the clocked inverter 55 is at "1". Then, when the terminal ($\phi$ bar) of the inverter 55 is shifted to "0", and the control terminal $\phi$ of the transfer gate is simultaneously shifted to "1" and hence turned on, the data supplied to the inverter 46 is written and held in it since at this time, the control terminal A of the clocked inverter 58 is at "1".

When the control terminal $\phi$ of the clocked inverter 56 is at "1", the written data is read out through the output terminal Q via the clocked inverter 56 and the inverter 47 and simultaneously transferred to the inverter 48. When the control terminal ($\phi$ bar) of the clocked inverter 59 is at "1", the data transferred to the inverter 48 is held in it. Since at this time, the control terminal B of the transfer gate 61 is at "0", the data is not output to a scan data output terminal SO.

The scan test mode of the scan register will be described. In FIG. 2, scan data input to a scan data input terminal SI is supplied to the inverter 46 when the control terminal (A bar) of the clocked inverter 57 and the control terminal $\phi$ of the transfer gate 60 are at "1". When the control terminal A of the clocked inverter 58 is at "1", the writing state is maintained.

When the control terminal $\phi$ of the clocked inverter 56 and the control terminal B of the transfer gate 61 are at "1", the written scan data is read through the scan data output terminal SO via the clocked inverter 56, the inverters 48 and 49, the transfer gate 61 and the inverter 50, and also through the output terminal Q via the inverter 47. When the terminal ($\phi$ bar) of the clocked inverter 59 is at "1", the read scan data is held in it.

The 1-bit static scan register shown in FIG. 2 is characterized in that two clock buffers are located near the register as indicated by the broken line, that the number of transistors incorporated in the register is increased to as many as forty-two in accordance with the addition of a function for scanning the register, and that the clock buffers drive eight transistors in total as in the aforementioned static scan register.

Thus, making the static register, which is used in the conventional LSI for image signal processing, have a scanning function inevitably increases the complexity and hence the chip size of the LSI as explained with reference to FIG. 2. This makes it difficult to reduce its manufacturing cost.

Since as described above, multiple static scan registers, which are employed in the conventional image signal processing LSI, have a complicated structure, the chip size required for the LSI is inevitably large, which prevents reduction of cost. The prior art cannot satisfy recent demands for reducing the cost and power consumption of the LSI and also the time required for testing it.

BRIEF SUMMARY OF THE INVENTION

This invention has been developed to solve the above-described problems, and aims, in particular, to reduce the circuit complexity and power consumption of a register structure including multiple registers and used for image signal processing, and also to shorten the time required for testing an LSI for image processing in which the registers are integrated.

To attain the object, there is provided a semiconductor integrated circuit having a clock generation circuit and a clock buffer circuit for generating a plurality of clock signals, a register group including a plurality of registers connected in series and operable in synchronism with the clock signals, at least one combinational circuit connected to the register group, and means for selecting one of a normal operation mode and a scan test mode for the register group, wherein the clock generation circuit receives a system clock $CP_{IN}$, a scan test mode selection signal $S_{MODEN}$, and clock $CPS_{IN}$, and outputs a clock $\phi$ and a clock ($\phi_1$ bar) controlled by the signal $S_{MODEN}$ such that the clocks have periods of "1" kept from overlapping each other, and also outputs a writing clock CPS used in the scan test mode;

the clock buffer circuit is located adjacent to the register group;

the register group consists of mixed arrangement of dynamic scan registers and dynamic nonscan registers connected in series;

each of the dynamic scan registers has a data input terminal D, a data output terminal Q, a scan data input terminal SI, and a scan data output terminal SO;

in the normal operation mode, data is set in the dynamic scan register, using the clock ($\phi_1$ bar) for writing the data through the data input terminal D, and the clock $\phi$ for reading the data through the data output terminal Q;

in the scan test mode, scan data is set in the dynamic scan register, using the clock CPS for writing the scan data through the scan data input terminal SI, and the clock $\phi$ for reading the scan data through the scan data output terminal SO and the data output terminal Q;

where the register group includes a plurality of the dynamic scan registers, the scan data output terminal SO of that one of the dynamic scan registers which is located in an earlier stage than another dynamic scan register is connected to the scan data input terminal SI of the another dynamic scan register in series;

in the scan test mode, the clock ($\phi_1$ bar) is set at "1" to write the data into the dynamic scan registers after the scan data is set in the dynamic scan registers using the clocks CPS and $\phi$;

the dynamic nonscan register has a data input terminal D and a data output terminal Q; and data is set in the dynamic nonscan register, using a clock ($\phi$ bar) for writing the data through the data input terminal D, and the clock $\phi$ for reading the data through the data output terminal Q.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the invention will be described in detail with reference to the accompanying drawings.

An LSI for image signal processing according to a first embodiment of the invention employs a group of registers as dynamic circuits each having a smaller number of elements than a static circuit and comprising dynamic nonscan registers and dynamic scan registers with a scan test function. This LSI can be shifted between normal operation mode and scan test mode with an external selection signal by operating the registers using a plurality of special clocks.

Since the embodiment is applicable not only to the LSI for image signal processing but also to a semiconductor integrated circuit which comprises a group of registers each consisting of a sequential circuit and at least one logic gate consisting of a combinational circuit, descriptions will be given of a semiconductor integrated circuit including dynamic registers.

Figure 3:
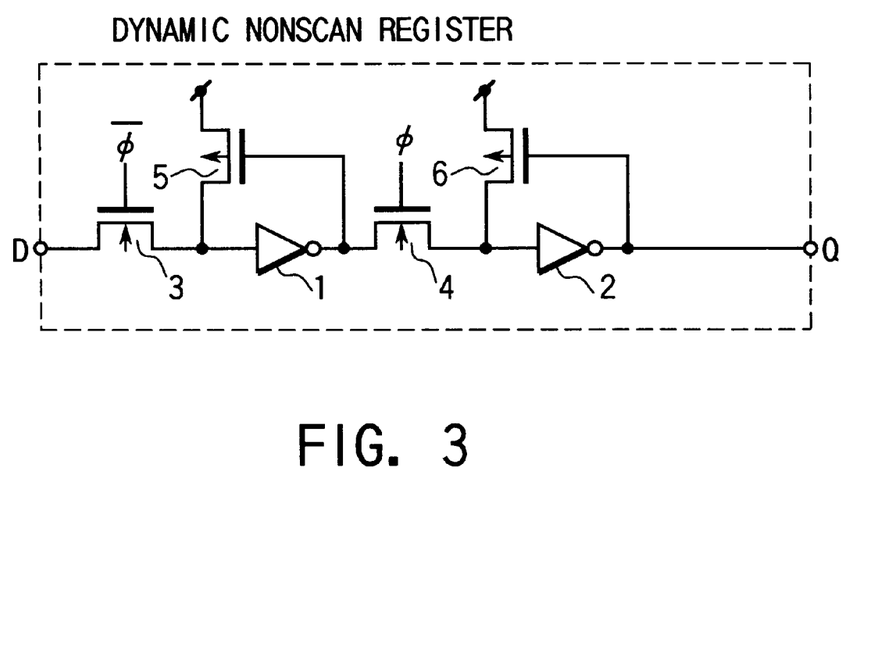
FIG. 3 is a circuit diagram, showing a dynamic nonscan register according to an embodiment of the invention.
Figure 4:
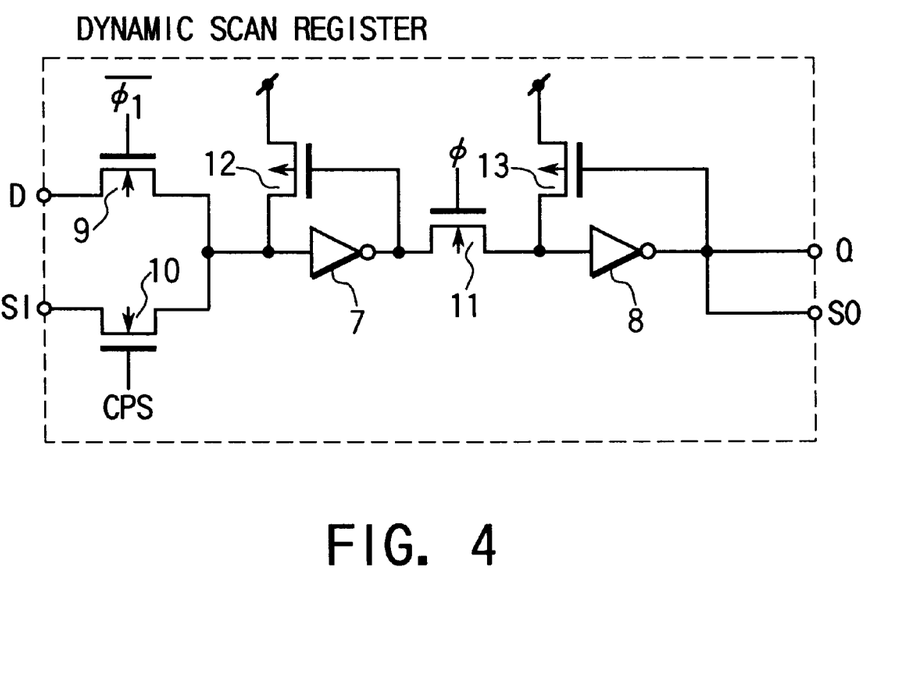
FIG. 4 is a circuit diagram, showing a dynamic scan register according to the embodiment of the invention.

FIGS. 3 and 4 show examples of a dynamic nonscan register and a dynamic scan register according to the embodiment of the invention.

As is shown in FIG. 3, the dynamic nonscan register comprises an inverter 1, N-channel transistors 3 and 4, and P-channel transistors 5 and 6.

The N-channel transistor 3 has its gate connected to a clock terminal ($\phi$ bar), its drain used as a data input terminal D, and its source connected to the input terminal of an inverter 1. The output terminal of the inverter 1 is connected to the drain of the N-channel transistor 4.

The output terminal of the inverter 1 is also connected to the gate of the P-channel transistor 5. The drain of the P-channel transistor 5 is connected to a power supply, and the source thereof to the input terminal of the inverter 1.

When in the circuit constructed as above, the clock terminal ($\phi$ bar) is at "1", data supplied from the data input terminal D to the inverter 1 via the N-channel transistor 3 is held by the P-channel transistor 5.

Further, in the dynamic nonscan register, the source of the N-channel transistor 4 is connected to the input terminal of an inverter 2, and the output terminal of the inverter 2 to an output terminal Q. The output terminal of the inverter 2 is also connected to the gate of the P-channel transistor 6, the source of the transistor 6 to the input terminal of the inverter 2, and the drain of the transistor 6 to the power supply.

When, the clock terminal $\phi$ is at "1" in the circuit constructed as above, data input from the inverter 1 to the inverter 2 via the N-channel transistor 4 is read from the output terminal Q and also held by the P-channel transistor 6.

Thus, the data input to the input terminal D is written into a holding circuit including the inverter 1 when the clock terminal $\phi$ bar) is at "1", and read from a holding circuit including the inverter 2 to the output terminal Q when the clock terminal $\phi$ is at "1".

The 1-bit dynamic nonscan register shown in FIG. 3 is characterized in that no clock buffer is incorporated near the register within a region indicated by the broken line, that the number of transistors used in the register is as small as 8, and that only a single transistor is driven by each of clocks $\phi$ and ($\phi$ bar).

FIG. 4 shows a dynamic scan register according to the embodiment of the invention. This register is obtained by imparting a scanning function to the dynamic nonscan register shown in FIG. 3, and comprises inverters 7 and 8, N-channel transistors 9, 10 and 11, and P-channel transistors 12 and 13.

The N-channel transistor 10 has its drain used as a scan data input terminal SI, its gate connected to a clock terminal CPS for writing scan data. The source of the transistor 10 is connected to the input terminal of the inverter 7 in parallel with the source of the N-channel transistor 9 having its drain connected to a data input terminal D, and its gate to a clock terminal ($\phi$ bar) for writing data.

The output terminal Q of the dynamic scan register is connected, in parallel, to a scan data output terminal SO. The other circuit elements are similar to those in FIG. 3, and duplicate explanations thereof will be omitted.

In the normal operation mode, data from the data input terminal D is written into the dynamic scan register of FIG. 4 when the writing clock terminal ($\phi$ bar) is at "1", and read from the output terminal Q when the reading clock terminal $\phi$ is at "1", as in the FIG. 3 case.

In the scan test mode, scan data input through the scan data input terminal SI is written into a holding circuit including the inverter 7 and the P-channel transistor 12 when the writing clock terminal CPS is at "1". On the other hand, when the reading clock terminal $\phi$ is at "1", the written scan data is output to the scan data output terminal SO and the data output terminal Q via the N-channel transistor 11 and the inverter 8, and simultaneously held by a holding circuit comprising the inverter 8 and the P-channel transistor 13.

The 1-bit dynamic scan register of FIG. 4 is characterized in that no clock buffer is incorporated near the register within a region indicated by the broken line, that the number of transistors used in the register is as small as 9, and that only a single transistor is driven by each of clocks $\phi$ and ($\phi_1$ bar).

Figure 5:
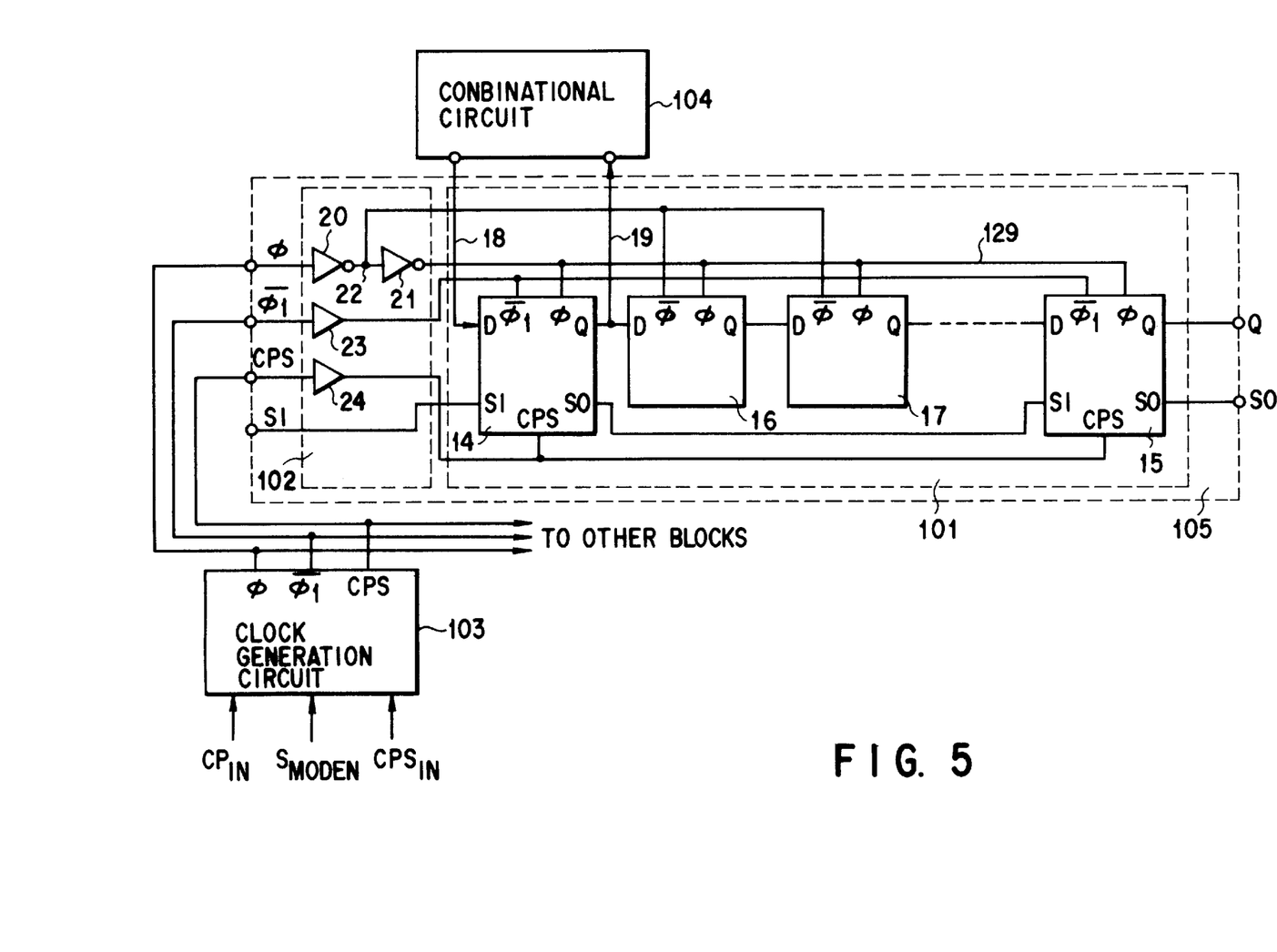
FIG. 5 is a block diagram, showing an example of a semiconductor integrated circuit which includes a dynamic register according to the invention.

Referring then to FIG. 5, an example of a semiconductor integrated circuit which incorporates dynamic registers according to the embodiment will be described.

As is shown in FIG. 5, a dynamic register unit according to the invention includes a register group 101 comprising dynamic scan registers 14 and 15 and dynamic nonscan registers 16, 17 . . . , a clock buffer 102 for distributing reading clock $\phi$, writing clocks ($\phi$ bar) and ($\phi_1$ bar) and clock CPS, and a clock generation circuit 103 for generating those clocks $\phi$, ($\phi_1$ bar) and CPS.

The semiconductor integrated circuit comprises the dynamic register unit including the circuits 101, 102 and 103, and at least one combinational circuit 104.

In the FIG. 5 structure, the registers are arranged in series such that the dynamic scan registers 14 and 15 are arranged at the initial stage and the final stage, respectively, and the dynamic nonscan registers 16, 17 . . . are arranged therebetween. On the other hand, the output data of the combinational circuit 104 is disposed to be written into the initial dynamic scan register 14 through its data input terminal D via a line 18, and data read from the data output terminal Q of the register 14 is returned to the input terminal of the combinational circuit 104 via a line 19.

The output terminal Q of the final dynamic scan register 15 may is used as one of the output terminals of the semiconductor circuit, or may be connected to the input terminal of another combinational circuit (not shown).

Although in the embodiment, the dynamic scan registers are arranged at the initial and final stages of the register group, the invention is not limited to this. In general, dynamic scan registers can be made to operate in a similar manner to the below if they are arranged at a former stage and a latter stage.

The clock buffer 102 located in the vicinity of the register group 101 comprises inverters 20 and 21 and buffers 23 and 24. The clock $\phi$ supplied from the clock generation circuit 103 is inverted by the inverter 20 and obtained as the clock ($\phi$ bar) at a node 22. The clock ($\phi$ bar) is supplied to the dynamic nonscan registers 16, 17, . . . The clock ($\phi$ bar) at the node 22 is regenerated as the clock $\phi$ by the inverter 21 and supplied to the dynamic scan registers 14, 15 and the dynamic nonscan registers 16, 17, . . .

The clocks ($\phi_1$ bar) and CPS supplied from the clock generation circuit 103 are input to the dynamic scan registers 14 and 15 via the buffers 23 and 24.

In the scan test mode, scan data supplied from the outside of the register unit is written into the initial dynamic scan register 14 through its scan data input terminal SI, and scan data read from the output terminal SO of the register 14 is written into the final dynamic scan register 15 through its input terminal SI. The scan data written into the register 15 is read from its output terminal SO.

The clock generation circuit 103 receives a system clock $CP_{IN}$, and clocks $S_{MODEN}$ and $CPS_{IN}$ for selecting the normal operation mode and the scan test mode, respectively, and generates the clocks $\phi$, ($\phi_1$ bar) and CPS to be input to the clock buffer circuit 102.

Figure 6:
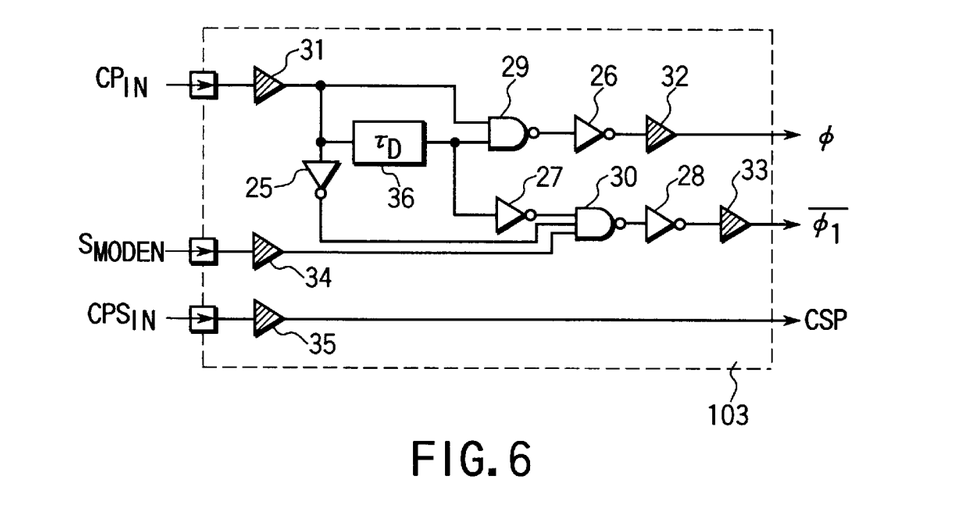
FIG. 6 is a circuit diagram, showing a clock generation circuit for supplying clocks to the dynamic register of the invention.

FIG. 6 shows an example of the clock generation circuit 103. The circuit 103 comprises inverters 25–28, NAND gates 29 and 30, buffers 31–35 and a delay circuit 36 with a delay time $\tau_D$.

The operation of the clock generation circuit 103 will be described in detail with reference to the circuit structure of FIG. 6 and the time charts of FIGS. 7 and 8.

Figure 7:
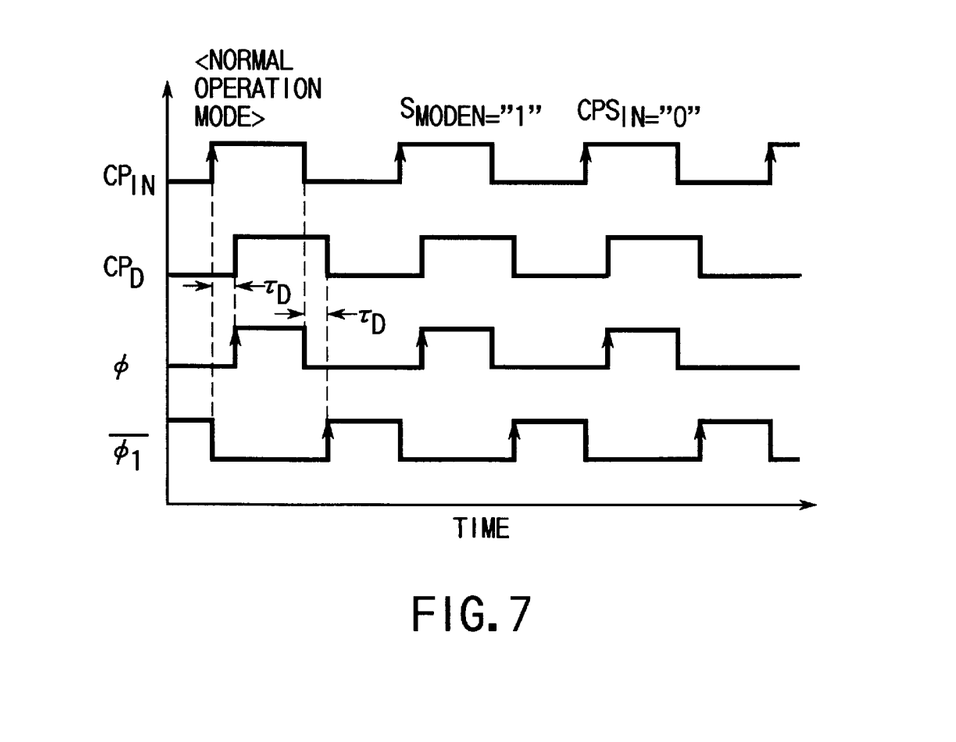
FIG. 7 is a time chart, useful in explaining the operations of essential parts of the clock generation circuit assumed at normal operation mode.

FIG. 7 shows the voltage waveforms, assumed in the normal operation mode, of essential parts of the clock generation circuit 103 incorporated in the semiconductor integrated circuit which includes dynamic registers. In the normal operation mode, the scan registers operate with the writing clock ($\phi_1$ bar) and the reading clock $\phi$, and the nonscan registers operate with the writing clock ($\phi$ bar) and the reading clock $\phi$.

In the normal operation mode, the clock generation circuit sets its terminals $S_{MODEN}$ and $CPS_{IN}$ at "1" and "0", respectively. As is shown in FIG. 6, a clock signal input to the terminal $CP_{IN}$ is supplied to one of the input terminals of the NAND gate 29 with two input terminals via the buffer 31.

Further, since the output terminal of the buffer 31 is connected to the other input terminal of the 2-input NAND gate 29 via the delay circuit 36 with the delay time $\tau_D$, a signal $CP_D$ which is in retard of the signal $CP_{IN}$ by $\tau_D$ is supplied to the 2-input NAND gate 29. Since the output terminal of the 2-input NAND gate 29 is connected to the inverter 26 and the buffer 32, the clock $\phi$ shown in FIG. 7, which rises in retard of the rise of the clock $CP_{IN}$ by $\tau_D$ and falls in synchronism with the fall of the clock $CP_{IN}$, is generated at the output terminal of the buffer 32.

The output terminal of the delay circuit 36 is connected, via the inverter 27, to a first input terminal of the NAND gate 30 with three input terminals. Further, the input terminal of the delay circuit 36 is connected to a second input terminal of the 3-input NAND gate 30 via the inverter 25 which is connected parallel to the gate 30. Moreover, since the clock $S_{MODEN}$ of "1" is input to a third input terminal of the 3-input NAND gate 30 via the buffer 34, the clock ($\phi_1$ bar) shown in FIG. 7 is generated at the output terminals of the inverter 28 and the buffer 33 which are connected to the output terminal of the gate 30.

At this time, the 3-input NAND gate 30 causes the fall of the clock ($\phi_1$ bar) to synchronize with the rise of the clock $CP_{IN}$ input to the second input terminal of the gate 30 via the inverter 25, and causes the rise of the clock ($\phi_1$ bar) to synchronize with the fall of the clock $CP_D$ input to the first input terminal of the gate 30 via the inverter 27.

In other words, when the clock $S_{MODEN}$ is set at "1", the reading clock $\phi$ and the writing clock ($\phi_1$ bar) for the dynamic scan register are output as clocks inverted to each other and having their "1" periods kept from overlapping each other, as is indicated by the broken lines in FIG. 7.

Using the clocks $\phi$ and ($\phi_1$ bar) having their "1" periods kept from overlapping each other enables reliable reading of data D from and writing of the same into the dynamic scan register in the normal operation mode.

Referring then to the time chart of FIG. 8, the operations of essential parts of the clock generation circuit 103 in the scan test mode will be described. In the scan test mode, the clocks $S_{MODEN}$ and ($\phi_1$ bar) are set at "0", and writing of scan data into the input terminal SI and reading of the scan data from the output terminal SO are repeated twice using the clocks CPS and $\phi$, thereby shifting the scan data and setting the scan data at the output terminals Q of the first and last dynamic scan registers 14 and 15.

Figure 8:
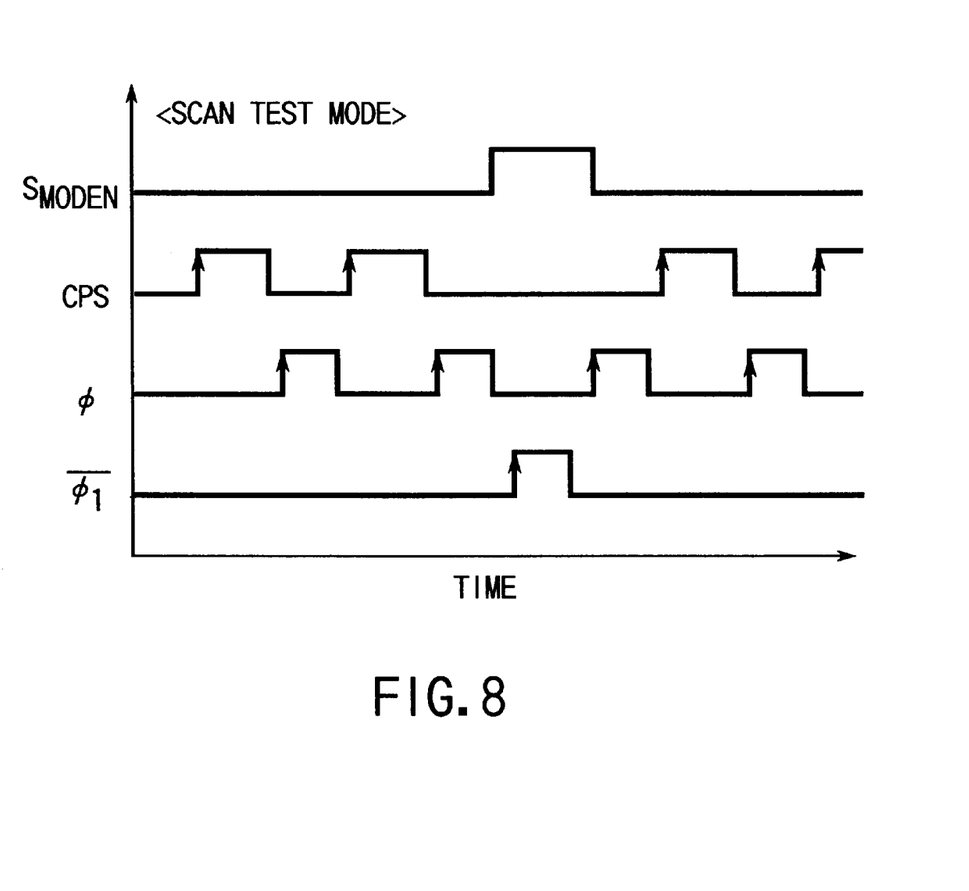
FIG. 8 is a time chart, useful in explaining the operations of essential parts of the clock generation circuit assumed in scan test mode.

Subsequently, as is shown in FIG. 8, the terminal $S_{MODEN}$ is set at "1", thereby generating the clock ($\phi_1$ bar) which has a "1" period kept from overlapping that of the clock $\phi$. At the same time, the terminal $CPS_{IN}$ is, at this time, set at "0" (i.e. the clock CPS with a value of "0" is input), thereby writing the output data of the combinational circuit into the dynamic scan register 14. On the other hand, the dynamic nonscan registers 16, 17, . . . are, at this time, operated using the writing and reading clocks ($\phi$ bar) and $\phi$ to prevent interruption of the operation of the dynamic register unit due to interruption of the clocks.

As described above, when predetermined data is set in that register group 101 incorporated in the semiconductor integrated circuit of the invention, which includes dynamic registers, and then the semiconductor integrated circuit is subjected to a function test, the register group 101 can be considered substantially equivalent to a combinational circuit. Accordingly, a test pattern for testing the function of the semiconductor integrated circuit including the register group can easily be created using a computer.

In the invention, the registers of the register group 101 are constituted of dynamic registers each consisting of a small number of elements, and only that part of the register group which is connected to the input and output terminals of each combinational circuit is formed of a dynamic scan register with a scanning function. As a result, the number of elements incorporated in the semiconductor integrated circuit including the register group, and the power consumption of the integrated circuit can considerably be reduced. These advantages are especially conspicuous in the case of an LSI for image signal processing which has multiple registers.

Furthermore, the influence of an additional circuit for scan can be minimized, if in the mixed arrangement of the dynamic scan registers and the dynamic nonscan registers, the test clocks are used together with the system clock $CP_{IN}$, and the clock buffer 102, in particular, is forcedly laid out within the region 105 indicated by the broken line in FIG. 5 such that it is located adjacent to the register group 101.

The invention is not limited to the above-described embodiment. As aforementioned, the dynamic scan registers, the dynamic nonscan registers and the combinational circuit can be arranged in various manners, as well as the arrangement shown in FIG. 5. The register group, which is formed as a macrocell and serves as a functional circuit block, may include scan registers arranged not only in series but also in parallel. Dividing the registers included in the register group to arrange them in parallel enables shortening of the required data transfer time and hence shortening of the time required for the function test.

Although the clock buffer circuit is preferably located adjacent to the register group formed as a macrocell, it can be located in a center portion of the region in which the register group is located, if it is hard to locate it adjacent to the register group in the LSI. Concerning the clock generation circuit, its circuit structure is not limited to the FIG. 6 structure but may be modified in various manners. Moreover, the invention may be modified without departing from its scope.

As described above, the semiconductor integrated circuit including dynamic registers of the invention requires a smaller chip size and a smaller amount of power than the conventional circuit incorporating static registers which make the semiconductor integrated circuit scannable. Further, in automatic layout design, the clock buffer circuit for the register group consisting of the dynamic registers is forcedly laid out such that it is located adjacent to the register group, thereby simplifying the circuit structure of the semiconductor integrated circuit and reducing the power consumption of the clock system. In particular, the area of the dynamic registers and the power consumption of the dynamic registers and the clock system can be reduced to about 1/3 of those in the case of using the static registers.

In addition, the special clock generation circuit employed in the invention enables the use of the register group which consists of the dynamic nonscan registers and the dynamic scan registers. Further, a connection test to be performed between the scan registers before or after testing the nonscan registers can be realized by modifying the CAD software for the ATPG (Automatic Test Pattern Generator).

The cost required for an LSI for image signal processing which, in particular, employs multiple registers can be significantly reduced by applying thereto the structure of the dynamic register of the invention, since by virtue of the application, the LSI can be highly integrated, can have its power consumption reduced, and can have its function test facilitated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor integrated circuit having a clock generation circuit and a clock buffer circuit for generating a plurality of clock signals, a register group including a plurality of registers connected in series and operable in synchronism with the clock signals, at least one combinational circuit connected to the register group, and means for selecting one of an operation mode and a scan test mode for the register group, wherein the clock generation circuit receives a system clock $CP_{IN}$, a scan test mode selection signal $S_{MODEN}$, and clock $CPS_{IN}$, and outputs a clock $\phi$ and a clock ($\phi_1$ bar) controlled by the signal $S_{MODEN}$ such that the clocks have periods of "1" kept from overlapping each other, and also outputs a writing clock CPS used in the scan test mode;

the clock buffer circuit is located adjacent to the register group;

the register group consists of mixed arrangement of dynamic scan registers and dynamic nonscan registers connected in series;

each of the dynamic scan registers has a data input terminal D, a data output terminal Q, a scan data input terminal SI, and a scan data output terminal SO;

in the operation mode, data is set in the dynamic scan register, using the clock ($\phi_1$ bar) for writing the data through the data input terminal D, and the clock $\phi$ for reading the data through the data output terminal Q;

in the scan test mode, scan data is set in the dynamic scan register, using the clock CPS for writing the scan data through the scan data input terminal SI, and the clock $\phi$ for reading the scan data through the scan data output terminal SO and the data output terminal Q;

where the register group includes a plurality of said dynamic scan registers, the scan data output terminal SO of that one of the dynamic scan registers which is located in an earlier stage than another dynamic scan register is connected to the scan data input terminal SI of said another dynamic scan register in series;

in the scan test mode, the clock ($\phi_1$ bar) is set at "1" to write the data into the dynamic scan registers after the scan data is set in the dynamic scan registers using the clocks CPS and $\phi$;

each of the dynamic nonscan registers has a data input terminal D and a data output terminal Q; and data is set in one of the dynamic nonscan register, using the clock ($\phi_1$ bar) for writing the data through the data input terminal D, and the clock $\phi$ for reading the data through the data output terminal Q.

* * * * *